United States Patent [19]

Siegfried

[11] 4,235,616
[45] Nov. 25, 1980

[54] OPTICAL WAVEGUIDE MANUFACTURING PROCESS AND ARTICLE

[75] Inventor: Robert W. Siegfried, Elmira, N.Y.

[73] Assignee: Corning Glass Works, Corning, N.Y.

[21] Appl. No.: 38,775

[22] Filed: May 14, 1979

[51] Int. Cl.³ .............................................. C03D 25/02
[52] U.S. Cl. ......................................... 65/3 A; 65/13;
65/18; 65/60 D; 350/96.3; 427/237
[58] Field of Search ................... 65/3 A, 18, 13, 60 D;
118/725; 425/237; 350/96.3

[56] References Cited

U.S. PATENT DOCUMENTS

| | | | |
|---|---|---|---|
| 4,090,055 | 5/1978 | King | 65/3 A X |
| 4,117,802 | 10/1978 | Sergent | 425/237 |

*Primary Examiner*—Robert L. Lindsay, Jr.
*Attorney, Agent, or Firm*—Walter S. Zebrowski; William J. Simmons, Jr.

[57] ABSTRACT

A method of forming a preform or blank for an optical filament, the preform itself, and resulting optical filament is disclosed. A hollow cylindrical substrate is provided within which is disposed a burner having a substantially radial flame. Reactants are flowed into the hollow cylindrical substrate in the annular space between the inner surface of said substrate and the exterior of said burner. A hot zone is established within the interior of said substrate in the vicinity of said radial flame so that the reactants are reacted to produce a suspension of particulate material. The burner is traversed substantially along the longitudinal axis of the substrate whereby the hot zone is caused to move along the length of said substrate. A portion of the particulate material formed within the hot zone travels downstream where at least a portion thereof comes to rest on the inner surface of the substrate to subsequently form a continuous glassy deposit thereon. A second burner at the exterior of said substrate may be employed to provide a source of heat from the exterior adjacent the hot zone. Also, a shield may be provided surrounding the burner within said hollow substrate and a stream of gas flowed within said shield around the burner to confine the flow of particulate material to an annular channel adjacent to the inner surface of the substrate increasing deposition efficiency of the particulate material on the inside surface of the substrate.

17 Claims, 6 Drawing Figures

OPTICAL WAVEGUIDE MANUFACTURING PROCESS AND ARTICLE

BACKGROUND OF THE INVENTION

This invention relates to optical filament transmission media and, more particularly, to an improved method of forming optical waveguide blanks or preforms from which such filaments are subsequently drawn and the articles produced therefrom.

Waveguides used in optical communication systems are herein referred to as optical waveguides, and are normally constructed of transparent dielectric material, such as glass or plastic. Optical waveguides are the most promising medium for use in optical communication systems operating in the visible or near visible spectra, and normally consist of an optical filament having transparent cores surrounded by a transparent cladding having a refractive index lower than that of the core.

Gradient index optical waveguides have a radially varying composition and consequently a radially varying refractive index. Reference is made to U.S. Pat. Nos. 3,823,995 to Carpenter and 3,711,262 to Keck and Schultz as examples of both gradient index optical waveguides and step index optical waveguides, as well as examples of formation of optical waveguides by inside vapor phase oxidation processes. U.S. Pat. No. 3,711,262 teaches both gradient and step index optical waveguides. Both of these patents are expressly incorporated herein by reference. The inside vapor phase oxidation process includes chemical vapor deposition, flame hydrolysis and any other species of the process by which vaporous material is directed into a heated tube, reacted with oxygen under the influence of heat and resultant particulate material is deposited on the inside wall surface of the tube. The material is deposited within the tube in one or more successive layers and the article so formed is then removed from the heat to leave a fused blank. As will be understood, the central hole may be collapsed at the end of the deposition process, the blank may subsequently be reheated and the hole collapsed, or the hole may be collapsed during the drawing process. In any event, the blank or preform is subsequently heated and drawn into an elongated, fine filament or strand. Inasmuch as the structure of the drawn strand or filament reflects the structure of the drawing blank or preform, it is important that the physical characteristics of the blank be carefully controlled.

Information concerning the construction and use of optical waveguides may be found in "Fiber Optics—Principles and Applications" by N. S. Kapany, Academic Press, 1967; "Geometrical Optics of Parabolic Index-Gradient Cylindrical Lenses" by F. P. Kapron, Journal of the Optical Society of America, Vol. 60, No. 11, pages 1433–1436, November 1970; and "Cylindrical Dielectric Waveguide Mode" by E. Snitzer, Journal of the Optical Society of America, Vol. 51, No. 5, pages 491–498, May 1961.

In order to effect the necessary change of the index of refraction of a blank or preform being formed by an inside vapor phase oxidation process, the chemical composition of the source materials, which, after reaction, comprise the ultimate material deposited on the inside surface of the tube, may be varied. The vapor mixture is hydrolyzed or oxidized and deposited on the inside surface of the glass tube and subsequently fused to form a high quality and purity glass. At the same time, one or more additional vapors can be supplied to the tube, each vapor being constituted of a chemical termed a "dopant" whose presence affects the index of refraction or other characteristics of the glass being formed.

The stringent optical requirements placed on the transmission medium to be employed in the optical communication systems has negated the use of conventional glass fiber optics, since attenuation due to both scattering and impurity adsorption is much too high. Thus, unique methods have been developed in preparing very high purity glasses in filamentary form. In one such process, the source material vapor is directed into a heated tube wherein it reacts to form the material which is deposited in one or more successive layers.

In order to obtain uniform deposition along the length of the substrate tube, a serial deposition process has been employed. That is, reactants are fed into the end of the tube, but deposition occurs only in a section of the tube downstream of the region which is heated by a flame. The flame moves up and down the exterior surface of the tube to move the reaction and thus the region of glass deposition serially along the tube.

One of the limitations of such a process is a comparatively low effective mass deposition rate. To increase the deposition rate it appears to be necessary to increase the inside diameter of the tube to provide a greater collection surface area. However, as tube diameter increases, a smaller portion of the reactant vapor flows in that region of the tube adjacent the wall where the sooty reaction products are more readily collected downstream of the heated region of the tube. Furthermore, sintering is the fundamental rate limiting part of the inside vapor phase oxidation process, and heat transfer to the particulate material deposited on the inside wall surface of the substrate increases in importance as larger, thicker walled tubing is used for substrate purposes.

DESCRIPTION OF PRIOR ART

No prior art directed to the formation of an optical waveguide preform wherein the hot zone within the starting member or substrate is occasioned by an internal burner having a substantially radial flame, with or without an additional shield, or with or without an additional exterior flame is known to exist. However, some of the following art includes references to the formation of an optical waveguide preform in connection with the fabrication of an optical waveguide.

West German publications Nos. 26 42 949 and 27 12 993 deal with internally coating a glass tube with silica by vapor deposition under a plasma influence. French publication No. 75 06989 teaches depositing a layer of glass inside a silica tube using an external flame and an external shaping roller by applying local inner pressure from a gas pressure jet to the tubular substrate.

U.S. Pat. No. 4,090,055 deals with forming a layer of fused silica which may be doped or undoped on the inner wall or fused silica tube by producing a plasma in the reactant gases flowing through the tube. The plasma is produced at substantially atmospheric pressure with cooling gas being passed along the outer wall of the tube. For a teaching of the application of particulate material, consolidation, and drawing reference is hereby made to U.S. Pat. No. 3,659,915 to R. D. Maurer and P. C. Schultz, U.S. Pat. No. 3,711,262 to D. B. Keck and P. C. Schultz, U.S. Pat. No. 3,737,292 to D. B. Keck, P. C. Schultz, and F. Zimar, U.S. Pat. No. 3,775,075 to D. B. Keck and R. D. Maurer, U.S. Pat.

No. 3,806,570 to J. S. Flamenbaum, P. C. Schultz, and F. W. Voorhees, U.S. Pat. No. 3,859,073 to P. C. Schultz, and U.S. Pat. No. 3,884,550 to R. D. Maurer and P. C. Schultz, all of which patents and publications are hereby expressly incorporated by reference.

As used herein, inside vapor phase oxidation includes "chemical vapor deposition", and other vapor phase oxidation methods. The phrase "chemical vapor deposition" means the formation of deposits by chemical reactions which take place on, at, or near the deposition surface, a definition set forth on page 3 of the text "Vapor Depostion" edited by C. F. Powell et al., New York, John Wiley & Sons, Inc., 1966, which text is hereby wholly expressly incorporated by reference. Any other procedure where variations well known in the art may be employed to effect the deposition of suitable coating of glass by chemical vapor deposition process, such as, for example that described on page 263 of the aforementioned Powell et al. text which states: "Another means for obtaining uniform coverage which also can yield high deposition efficiency, and which is especially applicable to the coating of the inside surfaces of a small bored tubing, is to heat only a small portion of the tubing to the deposition temperature . . . the section heated to the deposition temperature is slowly moved over the total length of the tube or the total area to be coated." In this connection, reference is also made to U.S. Pat. No. 3,031,338 issued on Apr. 24, 1962 to R. G. Bourdeau.

SUMMARY OF THE INVENTION

It is an object of this invention to provide a method of forming a preform by improving the heat transfer to the particulate material formed within a substrate tube the preform itself, and resulting optical filament.

Another object of this invention is to provide increased deposition rates for particulate material formed by reaction of reactants within a substrate tube to form a layer of glass on the inside surface thereof, and a method and article which overcomes the disadvantages heretofore noted.

Briefly, according to this invention, a method of forming an optical preform and an optical filament as well as the preform itself and the resulting optical filament is disclosed. A burner having a substantially radial flame is disposed within a hollow cylindrical substrate substantially along the longitudinal axis thereof. The vapor mixture including at least one compound, glass-forming precursor, together with an oxidizing medium is flowed through the hollow cylindrical substrate surrounding the burner. The substrate and vapor mixture is heated by means of the burner flame whereby a hot zone is established within the interior of said hollow substrate in the vicinity of said flame such that the vapor mixture and oxidizing medium is reacted to produce a suspension of particulate material. The burner is traversed substantially along the longitudinal axis of the substrate whereby the hot zone is caused to move along the length of the substrate. The particulate material travels downstream through the hollow cylindrical substrate where at least a portion of the particulate material comes to rest on the inner surface of the substrate to subsequently form a continuous glassy deposit on the inner surface thereof. The remainder of the particulate material is exhausted from the other end of the substrate. A shield may be disposed within the hollow cylindrical substrate intermediate the burner and the inner surface of the substrate, with the shield terminating at a point upstream or before the radial flame thereby leaving the radial flame exposed to the inside surface of the substrate. The shield would be of such a size as to define an annular space between the shield and the burner through which a stream of gas may be flowed around the burner. The stream of gas is emitted from the end of the shield to confine the flow of the particulate material formed to an annular channel adjacent the inner surface of the substrate whereby deposition efficiency of the particulate material on the inside surface of the substrate is increased. Further, a second source of heat may be directed to the exterior of the substrate adjacent the hot zone to still further increase the heat transfer and particulate material deposition. In an embodiment where a shield is used, it is translated substantially along the longitudinal axis of the substrate in synchronism with the burner. The article so formed may be heated to a temperature sufficient to close the aperture defined by the deposited layer of glass within the hollow cylinder to form a solid optical waveguide blank. Such a solid optical waveguide blank may thereafter be drawn to form an optical waveguide filament.

These and additional objects, features and advantanges of the present invention will become apparent to those skilled in the art from the following detailed description and the attached drawings, on which, by way of example, only the preferred embodiments of this invention are illustrated.

DETAILED DESCRIPTION OF THE INVENTION

It is to be noted that the drawings are illustrative and symbolic of the present invention and there is no intention to indicate scale or relative proportions of the elements shown therein.

Figure 1:
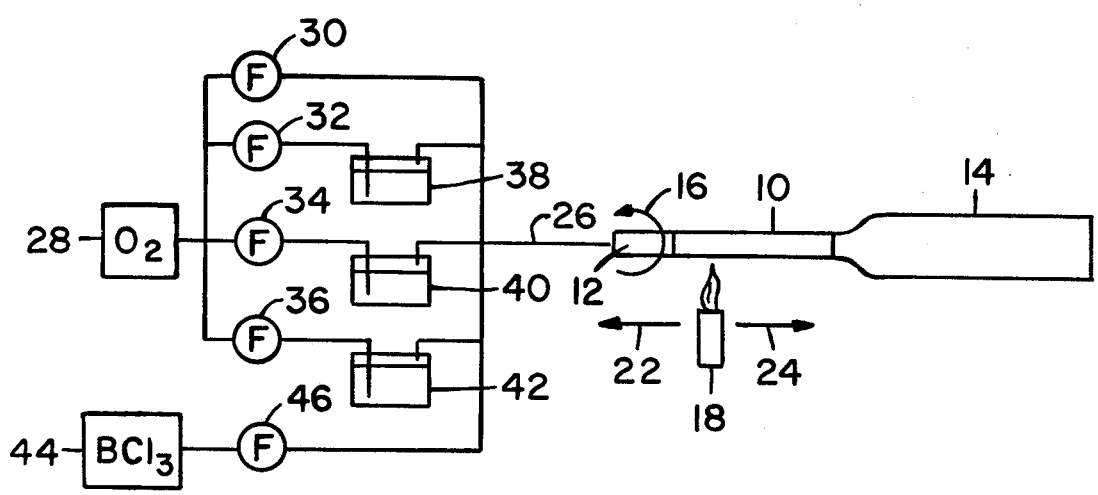
FIG. 1 is a schematic representation of a prior art apparatus for depositing a glass layer within a tube.
Figure 2:
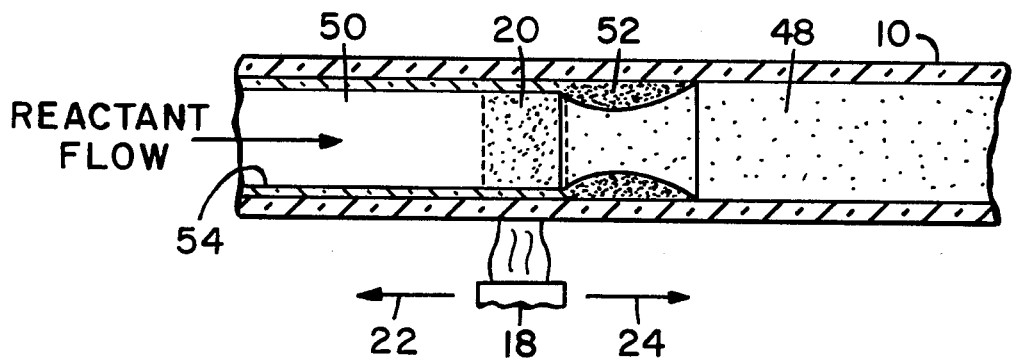
FIG. 2 is a fragmentary cross-sectional illustration of the tube of FIG. 1 depicting observed conditions during processing.

Referring to FIGS. 1 and 2 there is shown a prior art system for depositing a glass layer within a tube. Substrate tube 10 has handle tube 12 affixed to the upstream end thereof and exhaust tube 14 affixed to the downstream end thereof. Tubes 12 and 14 are chucked in a conventional glass turning lathe, not shown, but well known in the art, and the combination is rotated as indicated by arrow 16. Handle tube 12, which may be omitted if desired, may be an inexpensive glass tube having the same diameter as substrate tube 10, but it does not form a part of the resultant optical waveguide. A heating means 18 is provided and can consist of any suitable source of heat such as a plurality of burners encircling substrate tube 10. A hot zone 20 is created within substrate tube 10 by heating means 18 and is caused to traverse tube 10 along the longitudinal axis thereof by moving heating means 18 as schematically depicted by arrows 22 and 24.

Reactants are introduced into substrate tube 10 via inlet tube 26, which inlet tube is connected to a plurality of sources of gases and vapors. Specifically, in FIG. 1, flow meters are represented by a circle having the letter "F" therein. A source of oxygen 28 is connected by means of flow meter 30 to inlet tube 26 and by flow meters 32, 34, and 36 to reservoirs 38, 40, and 42 respectively. A source of boron trichloride ($BCl_3$) 44 is connected to inlet tube 26 by flow meter 46. Reservoirs 38, 40 and 42 contain normally liquid reactant materials which are introduced into substrate tube 10 by bubbling oxygen or other suitable carrier gas therethrough. Exiting material is exhausted through exhaust tube 14. Not shown is an arrangement of mixing valves and shut off valves which may be utilized to meter flows and to make other necessary adjustments in composition.

Heating means 18 initially moves at a low rate of speed relative to substrate tube 10 in the direction of arrow 24, the same direction as the reactant flow. The reactants react in hot zone 20 to produce soot, i.e., a powdery suspension of particulate oxidic material, which is carried downstream to region 48 of substrate tube 10 by the moving gas. In general, between 20 and 70 percent of the reaction product produced in the vapor stream results in a soot having the desired glass composition deposited on the inside substrate surface.

It is to be noted that essentially no soot is formed in region 50 of substrate tube 10 upstream from hot zone 20. As heating means 18 continue to move in the direction of arrow 24, hot zone 20 moves downstream so that a part of soot buildup 52 extends into the hot zone and is consolidated to form a unitary, homogeneous glassy layer 54. Such process parameters as temperatures, flow rates, reactants and the like can be found in the publications J. B. MacChesney et al., Proceedings of the IEEE, 1280 (1974) and W. G. French et al., Applied Optics, 15 (1976). Reference is also made to the text "Vapor Deposition" edited by C. F. Powell et al. hereinabove incorporated by reference.

When heating means 18 reaches the end of substrate tube 10 adjacent to exhaust tube 14, the temperature of the flame is reduced and the burner returns as the direction of arrow 22 to the input end of substrate tube 10. Thereafter, additional layers of glassy material are or may be deposited within substrate tube 10 in a manner described above. After suitable layers have been deposited to serve as the cladding and/or core material of the resultant optical waveguide filament, the temperature of the glass is increased to about 2200° C. for high silica content glass to cause the central aperture within substrate tube 10 to collapse and form a solid preform. This can be accomplished by reducing the rate of traverse of the hot zone. The resultant blank or preform is then drawn in accordance with well-known techniques to form an optical waveguide filament having the desired diameter.

To optimize the process from the standpoint of reaction, high temperatures are utilized. For the usual silica based system, temperatures of the substrate wall are generally maintained between about 1400° C. and about 1900° C. at the moving position corresponding with the hot zone. Indicated temperatures are those measured by a radiation pyrometer focused at the outer tube surface.

It is commonly known that one of the factors which limits the deposition rate is the rate of sintering deposited soot to form a transparent glass layer. For a given composition of glass to be deposited, there is a maximum layer thickness of glass that can be sintered using the optimum combination of hot zone width, peak temperature of hot zone and burner traverse rate. If the thickness of the sintered glass layer can be kept to the maximum value for different tube diameters, deposition rate increases proportionately with tube inside diameter because of increased surface area. However, because of the nature of flow dynamics of the reactant vapor stream and soot particle dynamics, the percentage of soot produced which deposits on the substrate tube surface decreases with increased tube diameter, thereby causing an effective decrease of deposition rate.

Figure 3:
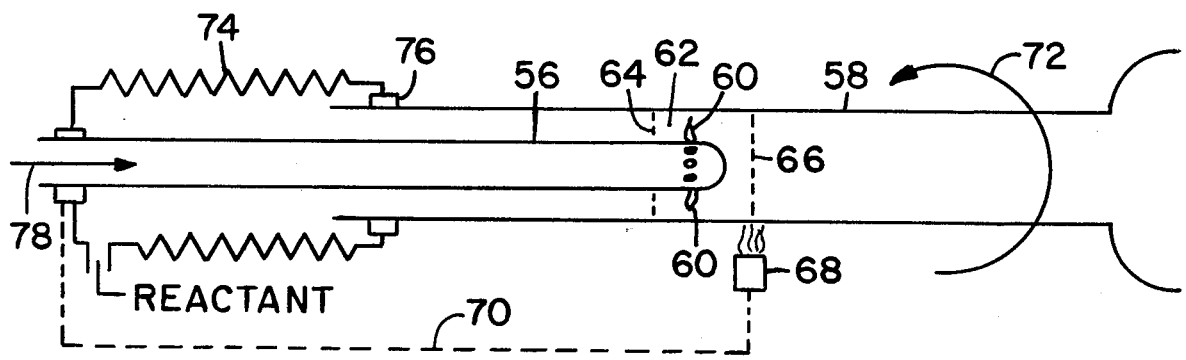
FIG. 3 is a schematic representation of an apparatus suitable for the practice of the deposition process in accordance with the present invention.

Referring to FIG. 3, there is schematically shown an illustration of one embodiment of the present invention wherein burner 56 is disposed within bait or substrate tube 58 substantially along the longitudinal axis thereof. Burner 56 provides a substantially radial flame 60 within the annular region between burner 56 and the inside surface of substrate tube 58. Flame 60 creates a hot zone 62, illustrated by broken lines 64 and 66, the hot zone being the space surrounding radial flame 60 wherein the temperature is sufficiently high to permit reaction of various reactants introduced therein to produce particulate material for deposition on the inside surface of substrate tube 58 as herein described. The temperature within hot zone 62 is also sufficiently high to permit the consolidation or sintering of the particulate material deposited on the inside surface of substrate tube 58 to form a glassy layer thereon.

Reactants, as herein described, are introduced into the system and caused to flow in the annular region between burner 56 and the inside wall of substrate tube 58 towards hot zone 62 wherein reaction between the reactants takes place. The reactants generally comprise at least one glass-forming precursor compound such as $SiCl_4$, $GeCl_4$, $POCl_3$, $BCl_3$, or the like together with an oxidizing medium such as oxygen. Under the influence of heat, the glass-forming precursor reacts with the oxygen to form the oxide thereof such as $SiO_2$, $GeO_2$, $P_2O_5$, $B_2O_3$, or the like, as is well understood in the art.

When a secondary heating means such as burner 68 is used it would be mechanically coupled to burner 56 by means well understood in the art and represented by dashed or broken line 70 to insure tht the proper and predetermined distance relationship is maintained between the output of burner 68 and radial flame 60 as well as hot zone 62. Alternately, as will be well understood in the art, burner 56 and optionally burner 68 may be kept stationary and the rotating substrate tube 58 may be traversed. As herein noted, substrate tube 58 is generally mounted in an apparatus such as a glass turning lathe and is caused to rotate as illustrated by arrow 72 so as to facilitate uniform deposition on the inside surface of substrate tube 58 of the particulate material formed within hot zone 62.

The input end of substrate tube 58 is connected to burner 56 by a collapsible member 74, a rotating seal 76 being disposed between collapsible member 74 and substrate tube 58. Fuel gas, as hereinafter described, and oxygen are introduced into burner 56 as illustrated by arrow 78. In order to avoid incorporation of hydrogen, hydrogen ions, water, or the like into the glass being formed, which hydrogen has deleterious effects on the light transmission properties of glass as is well understood in the art, fuel such as $CO$, $CS_2$, $C_2N_2$, or the like may be used.

Figure 4:
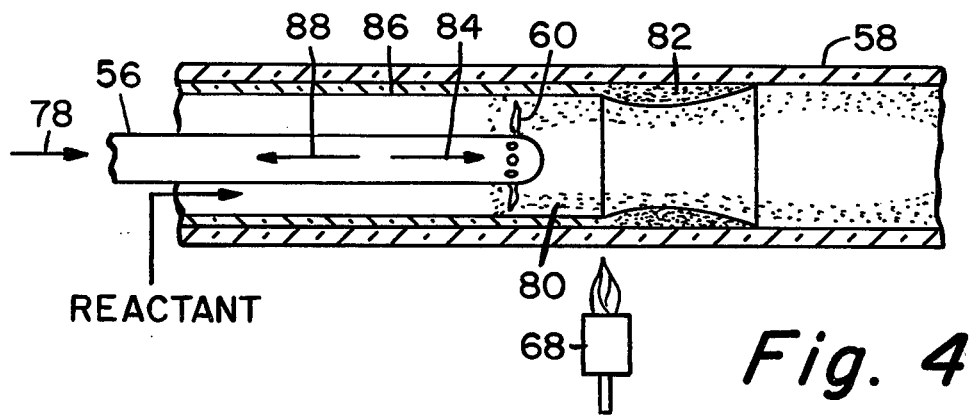
FIG. 4 is a fragmentary cross-sectional view of one embodiment of the present invention.

Referring additionally to FIG. 4, which is a cross-sectional view embodying the hot zone, substantially radial flame 60 and adjacent regions of substrate tube 58 are illustrated. Fuel and oxygen are introduced into burner 56 as illustrated by arrow 78 to produce substantially radial flame 60 to create a hot zone, as defined herein, within substrate tube 58 in the vicinity of radial flame 60. Reactant gases which are intended to form a glass to be applied to the inside surface of substrate tube 58 are introduced in the annular region between burner 56 and the inside surface of substrate tube 58. Such gases may be $SiCl_4$, $GeCl_4$, $POCl_3$, $BCl_3$, $O_2$, and the like. Gases such as $SiCl_4$, $GeCl_4$, $POCl_3$, $BCl_3$, and the like are glass-forming precursors while the oxygen is an oxidizing medium. As these reactants flow into the hot zone, they are caused to react under the influence of heat to form particulate material 80 in the form of small glass particles commonly referred to as soot. Particulate material 80 would be the oxide of the glass-forming precursor such as $SiO_2$, $GeO_2$, $P_2O_5$, $B_2O_3$, and the like. For a teaching of the application of particulate material, consolidation, drawing, and the like reference is hereby made to U.S. Pat. No. 3,659,915 to R. D. Maurer and P. C. Schultz, U.S. Pat. No. 3,711,262 to D. B. Keck and P. C. Schultz, U.S. Pat. No. 3,737,292 to D. B. Keck, P. C. Schultz, and F. Zimar, U.S. Pat. No. 3,775,075 to D. B. Keck and R. D. Maurer, U.S. Pat. No. 3,806,570 to J. S. Flamenbaum, P. C. Schultz, and F. W. Voorhees, U.S. Pat. No. 3,823,995 to L. L. Carpenter, U.S. Pat. No. 3,859,073 to P. C. Schultz, U.S. Pat. No. 3,884,550 to R. D. Maurer and P. C. Schultz, U.S. patent application Ser. No. 929,416, filed July 31, 1978 by R. Olshansky and A. Sarkar, and U.S. application Ser. No. 929,415, filed July 31, 1978 by R. Olshansky and A. Sarkar, all of which patents and applications have either hereinabove or are hereby expressly incorporated by reference. Suitable means for delivering reactants may be any means known in the art, for an illustration of which, reference is made to U.S. application Ser. No. 872,619, filed Jan. 26, 1978 by M. A. Aslami, or U.S. application Ser. No. 016,446, entitled "Reactant Delivery System" filed Mar. 1, 1979 by Michael G. Blankenship, which applications are hereby also expressly incorporated by reference.

After particulate material 80 is formed in the hot zone, it travels downstream whereby some of it adheres to the inside surface of substrate tube 58 forming porous soot buildup 82, the remainder of particulate material 80 being exhausted out through the end of substrate tube 58 opposite the end into which the reactants are introduced. Burner 56 is caused to be traversed with respect to substrate tube 58 in the direction illustrated by arrow 84. As burner 56 travels in the direction of arrow 84 so does the hot zone surrounding radial flame 60. As the hot zone reaches soot buildup 82, the soot is caused to consolidate forming a solid glass layer 86 on the inside wall of substrate tube 58. It will be understood that as burner 56 continues to travel the hot zone travels with it continuously forming new particulate material which is deposited downstream while consolidating the soot buildup in the path of the hot zone until the end of the deposition portion of substrate tube 58 is reached, whereupon, the temperature of radial flame 60 is reduced and burner 56 is rapidly returned to its starting position in the direction indicated by arrow 88. If desired, the process is repeated to form one or more additional layers of material on the inside surface of substrate tube 58. The number of layers deposited in the manner described hereinabove is determined by the desired cross section of the ultimate article formed hereby, which in turn depends on the thickness of each deposited glass layer, its composition, and the like. If desired, additional heat may be provided by burner 68 at the exterior surface of substrate tube 58 in the manner known in the prior art. Such additional heat may be desirable for faster consolidation of the soot buildup, improved heat transfer characteristics through the tube, and the like. When substrate tube 58 is particularly thick, a supplemental source of heat such as burner 68 is desirable to maintain a suitable temperature gradient across substrate tube 58.

Figure 5:
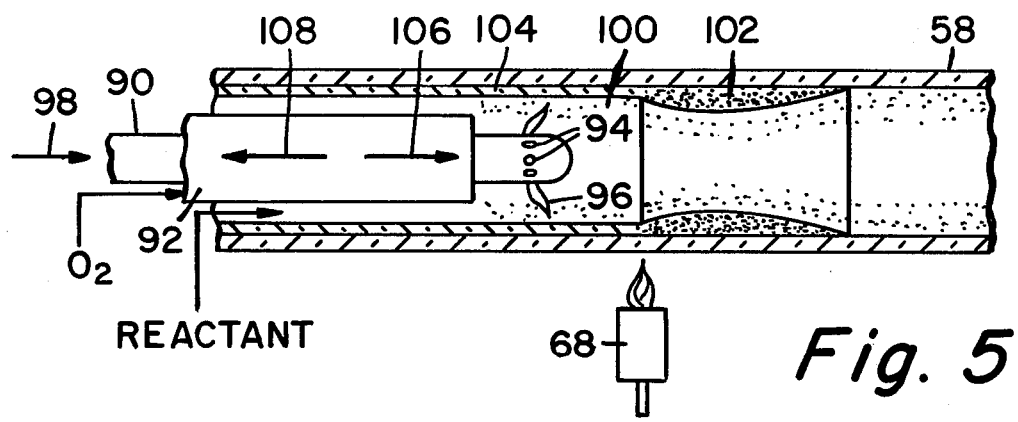
FIG. 5 is a fragmentary cross-sectional view of another embodiment of the present invention.
Figure 6:
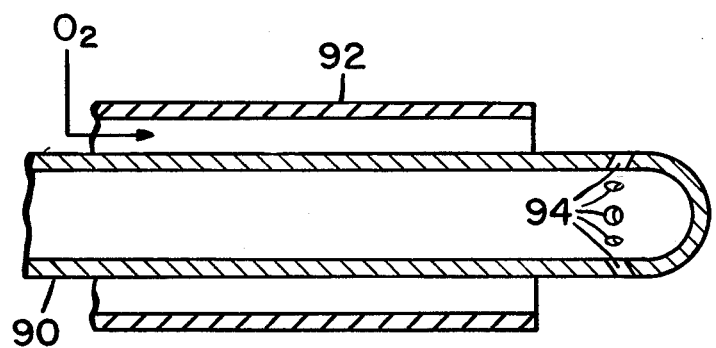
FIG. 6 is a fragmentary cross-sectional view of the burner and shield as illustrated in FIG. 5.

Another embodiment of the present invention is illustrated in FIG. 5 wherein burner 90, similar to burner 56 described in connection with FIG. 4, is disposed within substrate tube 58. In this embodiment, an additional shield 92 is disposed intermediate the outside surface of a burner 90 and the inside surface of substrate tube 58. Shield 92 may be affixed to burner 90 along its length so as to form a substantially uniform annular space between the inside surface of shield 92 and the outside surface of burner 90. Shield 92 is terminated short of the flame ports 94 of burner 90 to permit substantially radial flame 96 to create a hot zone as hereinabove described. As burner 90 operates in a manner as heretofore described in connection with burner 56 of FIG. 4, oxygen is introduced in the annular space between the outside surface of burner 90 and the inside surface of shield 92 and is emitted out the end thereof in the direction of substantially radial flame 96. Fuel and oxygen are introduced into burner 90 as illustrated by arrow 98. A simplified fragmentary cross section of burner 90 and shield 92 is illustrated in FIG. 6.

As the reactants flow into the hot zone created by substantially radial flame 96 to react and produce particulate material 100 the oxygen emitted from the end of shield 92 forces the particulate material out in the direction of the inside wall of substrate tube 58 improving the deposition efficiency or the amount of particulate material that is ultimately deposited on the inside surface of substrate tube 58. The particulate material deposits as a soot buildup 102 to form a glass layer 104 upon consolidation in the manner hereinabove described. Since the flow of oxygen around burner 92 forces the particulate material against the inside wall of substrate tube 58, soot buildup 102 is illustrated as being somewhat longer than the soot buildup 82 of FIG. 4 because more of the particles will adhere to the wall rather than be exhausted out the end of substrate tube 58. As described in connection with FIG. 4, a supplemental burner 68 may be used at the exterior surface of substrate tube 58 for the same reasons as described hereinabove.

It will be noticed that flame ports 94 and radial flame 96 are illustrated as being somewhat at an angle from the true radial direction. Such direction of radial flame 96 is still considered herein as substantially radial but changes the characteristics of the heat zone and is equally applicable to burner 56 of FIG. 4.

It will be further understood that burner 90 and shield 92 would, as a practical matter, be translated back and forth as indicated by arrows 106 and 108 substantially in synchronism and additional layers 104 may be applied as described in connection with FIG. 4.

It will be understood that the material from which the inside burner of the present invention is formed is not critical so long as it can withstand and is compatible with the temperature and environment within which it is used. An example of suitable burner material is $Al_2O_3$ or the like. The material of the substrate tube upon which deposition may take place is similarly not critical and would be readily determined by one familiar with the art for the specific use to which the ultimate article would be put. For optical waveguide purposes, silica, 96 percent silica "VYCOR" brand, or the like materials would be suitable.

A specific example of the method of forming an optical device and the apparatus of the present invention is as follows. A 96 percent silica "VYCOR" brand substrate tube having an outside diameter of 38 millimeters and a wall thickness of 2 millimeters was mounted in a glass turing lathe. A burner of the type illustrated in FIG. 4 having an outside diameter of ⅜ inch formed of $Al_2O_3$ tubing was provided. Eight flame orifices or ports having a diameter of 0.045 inch diameter were formed in a substantially radial and equidistant pattern near the closed end thereof. $CS_2$ vapor fuel was provided for the burner. Liquid $CS_2$ was maintained at 35° C. during the operation of the burner and was flowed to the burner as a vapor with argon as a carrier gas. An outside burner was used and adjusted to give a peak substrate tube temperature in conjunction with the inside burner of approximately 1800° C. at the outside tube surface of the hot zone as measured by an optical pyrometer. The traverse rate of the inside burner was approximately 9.6 centimeters per minute. Reactants were flowed from an apparatus similar to that described in the heretofore noted Aslami application. Experiments were run as described in FIGS. 1 and 2 representing the prior art and FIGS. 3 and 4 of the present invention, the results being as illustrated in Table I following. In each experiment the dopant flows were increased until sintering was no longer possible during a single pass of the burner.

TABLE I

|  | Conventional FIGS. 1 and 2 | Inside Burner FIGS. 3 and 4 |
| --- | --- | --- |
| $BCl_3$ flow in sccm | 3.8 | 30 |
| $SiCl_4$-CARRIER $O_2$ in slm | 0.04 | 0.3 |
| estimated $SiCl_4$ in g/min | 0.2 | 1.6 |
| REACTANT $O_2$ in slm | 9.34 | 9.34 |
| FUEL PREMIX $O_2$ in slm | — | 0.47 |
| FUEL $CS_2$-CARRIER Ar in slm | — | 1.18 |
| estimated $CS_2$ in g/min | — | 5.3 |
| PARTICLE DEPOSITION RATE in g/min | 0.033 | 0.165 |

The results indicate that an approximate five-fold increase in deposition rate was possible at the maximum dopant flows for this high viscosity glass. Sintering is the fundamental rate-limiting process in the inside vapor phase oxidation process of forming optical waveguides, and heat transferred to the soot deposit will increase in importance as larger, thicker walled tubing is used for the substrate tube. Through improved heat transfer, the inside burner of the present invention will allow soot sintering rates, and therefore deposition rates, to be increased. In addition, higher-viscosity glasses may be deposited with the inside burner than are feasible with the prior art inside vapor phase oxidation process.

Another specific example of the method of forming an optical device of the present invention is as follows. Employing the parameters outlined for the preceeding example, experiments were run as described in FIGS. 1 and 2 representing the prior art and FIGS. 3 and 4 of the present invention, the results being as illustrated in Table II following.

TABLE II

|  | Conventional FIGS. 1 and 2 | Inside Burner FIGS. 3 and 4 |
| --- | --- | --- |
| $BCl_3$ flow in sccm | 150 | 150 |
| $SiCl_4$-CARRIER $O_2$ in slm | 0.8 | 0.8 |
| estimated $SiCl_4$ in g/min | 4.2 | 4.2 |
| REACTANT $O_2$ in slm | 4.0 | 9.4 |
| FUEL PREMIX $O_2$ in slm | — | 0.47 |
| FUEL $CS_2$-CARRIER Ar in slm | — | 1.18 |
| estimated $CS_2$ in g/min | — | 5.3 |
| PARTICLE DEPOSITION RATE in g/min | 0.37 | 0.52 |

The results indicate in excess of 40 percent increase in deposition rate was possible at the maximum dopant flows for this substantially softer glass than that of the preceeding example.

Although the present invention has been described with respect to specific details of certain embodiments thereof, it is not intended that such details be limitations upon the scope of the invention except insofar as set forth in the following claims.

I claim:

1. A method of manufacturing an optical device comprising the steps of
   providing a hollow cylindrical substrate,
   disposing within said hollow cylindrical substrate, and substantially along the longitudinal axis thereof, a burner having a substantially radial flame,
   flowing a vapor mixture including at least one compound, glass-forming precursor, together with an oxidizing medium through said hollow cylindrical substrate surrounding said burner,
   heating said substrate and said vapor mixture by means of said burner flame, whereby a hot zone is established within the interior of said hollow substrate such that said vapor mixture and oxidizing medium is reacted to produce a suspension of particulate material, and
   traversing said burner with respect to said substrate along the longitudinal axis of said substrate, whereby said hot zone is caused to move along the length of said substrate, at least a portion of said particulate material travels downstream where at least a portion thereof comes to rest on the inner surface of said substrate to subsequently form a continuous glassy deposit on the inner surface thereof, the remainder of said particulate material being exhausted from the other end of said substrate.

2. The method of claim 1 further comprising a second source of heat directed to the exterior of said substrate adjacent said hot zone.

3. The method of claim 1 further comprising the steps of
   providing a shield surrounding said burner intermediate said burner and the inner surface of said substrate, said shield terminating at a point before said radial flame thereby leaving said radial flame exposed to the inside surface of said substrate, and flowing a stream of gas through said shield around said burner, said stream of gas being emitted from the end of said shield to confine the flow of said particulate material to an annular channel adjacent the inner surface of said substrate, whereby deposition efficiency of said particulate material on the inside surface of said substrate is increased.

4. The method of claim 3 further comprising the steps of translating said shield along the longitudinal axis of said substrate in synchronism with said burner.

5. The method of claim 4 wherein said stream of gas comprises oxygen.

6. The method of claim 1 further comprising the steps of removing said burner and thereafter heating said substrate to a temperature sufficient to close the aperture therein thereby forming a solid optical waveguide blank.

7. The method of claim 6 further comprising the steps of heating said solid optical waveguide preform to the drawing temperature of the materials thereof and drawing said blank to form an optical waveguide filament.

8. The method of claim 1 wherein said burner produces heat for reacting said vapor mixture with said oxidizing medium within said hot zone and consolidates the resulting particulate material into a layer of glass on the inside surface of said substrate.

9. The method of claim 3 wherein the flow of said stream of gas is substantially laminar.

10. The method of claim 3 wherein said shield and said burner are maintained at a spaced relation by mechanical coupling.

11. The article made by the method of claim 1.

12. An apparatus for manufacturing an optical device comprising means for supporting a hollow cylindrical substrate, burner means providing a substantially radial flame for heating an axial section of said substrate thereby forming a hot zone within said substrate adjacent said flame, means for moving said burner means longitudinally with respect to said substrate, and means for introducing into one end of said substrate surrounding said burner means a moving stream of a vapor mixture including at least one compound, glass-forming precursor, together with an oxidizing medium, said vapor mixture being reactable within said hot zone to form suspension of particulate material which travels downstream where at least a portion thereof comes to rest on the inner surface of said substrate.

13. The apparatus of claim 12 further comprising a second burner means disposed at the exterior surface of said substrate adjacent said hot zone.

14. The apparatus of claim 12 further comprising shield means disposed within said hollow substrate intermediate the inside surface of said substrate and said burner means, said shield means forming an annular region between said shield means and said burner means suitable for passing a gas therebetween, said shield means extending within said hollow substrate to a point where said substantially radial flame is exposed to the inside surface of said substrate.

15. The apparatus of claim 14 further comprising means for maintaining a relatively fixed relationship between said burner means and said shield means.

16. The apparatus of claim 15 further comprising means for translating said burner means and said shield means in synchronism longitudinally with respect to said substrate.

17. The article made by the method of claim 7.

* * * * *